United States Patent
Liu

(10) Patent No.: US 7,884,026 B2
(45) Date of Patent: Feb. 8, 2011

(54) METHOD OF FABRICATING DUAL DAMASCENE STRUCTURE

(75) Inventor: An-Chi Liu, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 910 days.

(21) Appl. No.: 11/458,689

(22) Filed: Jul. 20, 2006

(65) Prior Publication Data

US 2008/0020581 A1   Jan. 24, 2008

(51) Int. Cl.
*H01L 21/302* (2006.01)

(52) U.S. Cl. .............. 438/735; 438/629; 438/714; 438/717; 438/723

(58) Field of Classification Search .......... 438/706, 438/710, 712, 714, 720, 723, 597, 627, 6, 438/629, 717, 734, 735
See application file for complete search history.

(56) References Cited

U.S. PATENT DOCUMENTS

| 6,325,948 B1* | 12/2001 | Chen et al. ............... 216/67 |
| 6,559,049 B2* | 5/2003 | Chen et al. ............... 438/637 |
| 6,649,515 B2* | 11/2003 | Moon et al. .............. 438/637 |
| 7,311,797 B2 | 12/2007 | O'Donnell et al. |
| 7,564,136 B2* | 7/2009 | Yeh et al. ................ 257/773 |
| 2004/0026364 A1 | 2/2004 | Kihara |
| 2004/0134608 A1 | 7/2004 | Forester |
| 2005/0126488 A1* | 6/2005 | Ogasawara et al. ....... 118/723 E |
| 2005/0170625 A1* | 8/2005 | Cong et al. .............. 438/597 |
| 2005/0272265 A1 | 12/2005 | Geffken |

FOREIGN PATENT DOCUMENTS

| CN | 1405849 A | 3/2003 |
| CN | 1507502 A | 6/2004 |
| CN | 1663017 A | 8/2005 |
| TW | 516182 | 1/2003 |
| TW | 580756 | 3/2004 |
| WO | 02090615 A1 | 11/2002 |

* cited by examiner

*Primary Examiner*—Lan Vinh
(74) *Attorney, Agent, or Firm*—Winston Hsu; Scott Margo

(57) ABSTRACT

A semiconductor wafer includes a substrate, a conductive layer, a dielectric layer having a via, a hard mask defined a trench pattern, and a sacrificial layer. Then a sequential of etching processes is performed upon the semiconductor wafer in a chamber to form a trench and expose the conductive layer. By operating all procedures within one chamber, manufacturing time is efficiently shortened and yield is thus increased.

13 Claims, 8 Drawing Sheets

METHOD OF FABRICATING DUAL DAMASCENE STRUCTURE

BACKGROUND OF THE INVENTION

1. Field of the Invention

The invention is related to a method of fabricating a dual damascene structure, and more particularly, to a method of fabricating a dual damascene structure integrating all etching steps in the same etching chamber.

2. Description of the Prior Art

The multilevel interconnects of an integrated circuit are fabricated by damascene processes, which include single damascene and dual damascene processes. The dual damascene process may reduce 20-30% of the steps of fabrication and also reduce the contact resist between metal lines and vias to improve reliability. Therefore, most of the metal interconnections in the integrated circuit are formed by dual damascene processes. At present, the conventional method of fabricating a dual damascene structure is to etch low-K dielectric layers to form a trench and a via hole. Then, the via hole and the trench are filled with copper, and a planarization process is performed to form the metal interconnects. This structure may reduce the resist and the parasitic capacity of the metal interconnections, and accelerate signal transduction. The etching process has a very important role in dual damascene processes.

Different forming sequences of dual damascene structure, such as a trench-first dual damascene process, a via-first dual damascene process, and a partial-via-first dual damascene process, use plasma gas to etch the dielectric layers. The etching chamber is kept in a vacuum. Most conventional etching chambers employ a "deposition mode" during wafer processing, i.e. a polymer layer is deposited on the wall surface of the etching chamber before etching. This may prevent the plasma gas from etching the wall surface of the etching chamber, which causes metal contamination. In addition, the polymer layer has a higher selectivity than the photoresist pattern used as a mask during etching. After the first etching process step, such as a via hole etching process, however, the photoresist pattern is removed in an ashing process and a cleaning step. Sequentially, another etching mask or photoresist pattern is formed to perform the second etching process step, such as a trench etching process. Because the majority of the photoresist is organic material, an additional photoresist stripper is used to remove the photoresist pattern. Therefore, the etching chamber has to be vented to remove the semiconductor wafer, and the semiconductor wafer is transferred to the photoresist stripper for the following ashing and cleaning processes. Afterward, the semiconductor wafer is returned to the etching chamber and the chamber is once more placed in a vacuum for performing the next etching process step. If, however, the photoresist is removed directly by an oxygen plasma gas in the etching chamber, the polymer layer on the wall surface of the etching chamber may be removed along with the photoresist.

Different etching processes may be performed in one etching chamber. This can cause a prior etching process to affect a later one. This is known as a "memory effect". The unstable environment of the etching chamber causes the dual damascene structure to be of poor quality and affects the stability of the semiconductor device. For this reason, the etching process and the ashing process of the dual damascene structure have to be performed in different etching chambers, or even in different machines. The prior art method of forming the dual damascene structure includes steps of: 1) venting the etching chamber; 2) transferring the semiconductor wafer between different machines; 3) vacuuming the etching chamber; and 4) transferring the semiconductor wafer by mechanical arms. In addition, the time required for forming the dual damascene structure also includes the time for warming machines. Complex steps of the transportation process may also affect the yield of the fabrication.

SUMMARY OF THE INVENTION

It is therefore a primary objective of the present invention to provide a method of fabricating a dual damascene structure to reduce the cost and overcome the above-mentioned difficulties.

The present invention discloses a method of fabricating a dual damascene structure on a semiconductor wafer. The semiconductor wafer comprises a substrate, a conductive layer, a dielectric layer comprising a via hole, a hard mask comprising a trench pattern, and a sacrificial layer disposed on the hard mask, the dielectric layer, and the via hole. The method is performed in an etching chamber and comprises at least two sequential steps. Initially, a first etching process is performed. The first etching process uses an oxygen ($O_2$) based plasma gas to etch a part of the sacrificial layer and expose the hard mask, the dielectric layer, and a part of the via hole. A second etching process is then performed. The second etching process uses a tetrafluoromethane ($CF_4$) based plasma gas to etch the dielectric layer to form a trench. Then, a third etching process is performed. The third etching process uses an oxygen based plasma gas to remove the sacrificial layer to expose the dielectric layer through the via hole.

The present invention also discloses a method of ashing and etching to fabricate a dual damascene structure on a semiconductor wafer in an etching chamber. The semiconductor wafer comprises a substrate, a conductive layer, a cap layer, a dielectric layer comprising a via hole and a trench, a hard mask comprising a trench pattern, and a photoresist filled in the via hole. At first, an ashing process is performed. The ashing process uses an oxygen based plasma gas to remove the photoresist to expose the cap layer through the via hole. Then, an etching process is performed. The etching process uses a tetrafluoromethane based plasma to etch the cap layer to expose the conductive layer through the via hole.

The method of the present invention performs at least two sequential etching steps in the same etching chamber that substantially increases throughput. The method of the invention may perform two sequential etching steps, three sequential etching steps, or four sequential etching steps, and thus the method of the present invention has advantages of flexibility and easy-regulation. Therefore, the method of the invention is adaptable for manufacturing machine management.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 1:
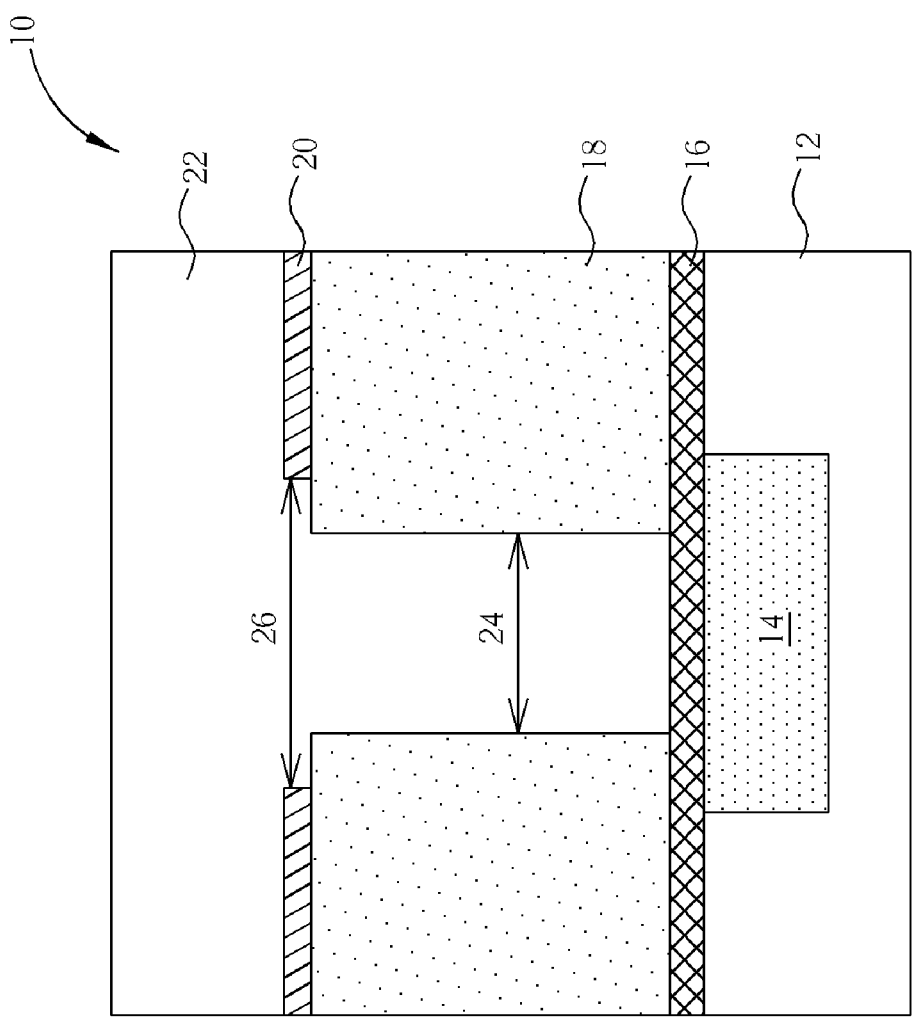
FIGS. 1 to 5 illustrate a method of fabricating a dual damascene structure according to a preferred embodiment of the present invention.

FIGS. 1 to 5 illustrate a method of fabricating a dual damascene structure according to a preferred embodiment of the present invention. As shown in FIG. 1, a semiconductor wafer 10 is provided. The semiconductor wafer 10 comprises a substrate 12, a conductive layer 14, a cap layer 16, a dielectric layer 18 comprising a via hole 24, a hard mask 20 having a trench pattern 26, and a sacrificial layer 22 disposed on the hard mask 20, the dielectric layer 18, and the via hole 24. In the preferred embodiment, the conductive layer 14 comprises a metal conductive layer, e.g. a metal conductive layer of copper. The cap layer 16 and the hard mask 20 may comprise silicon nitride, silicon carbide, or silicon oxynitride. The dielectric layer 18 comprises low-k materials, such as fluorinated silica glass, or organo-silicate. The sacrificial layer 22 comprises a photoresist as the major material in the preferred embodiment.

Figure 2:
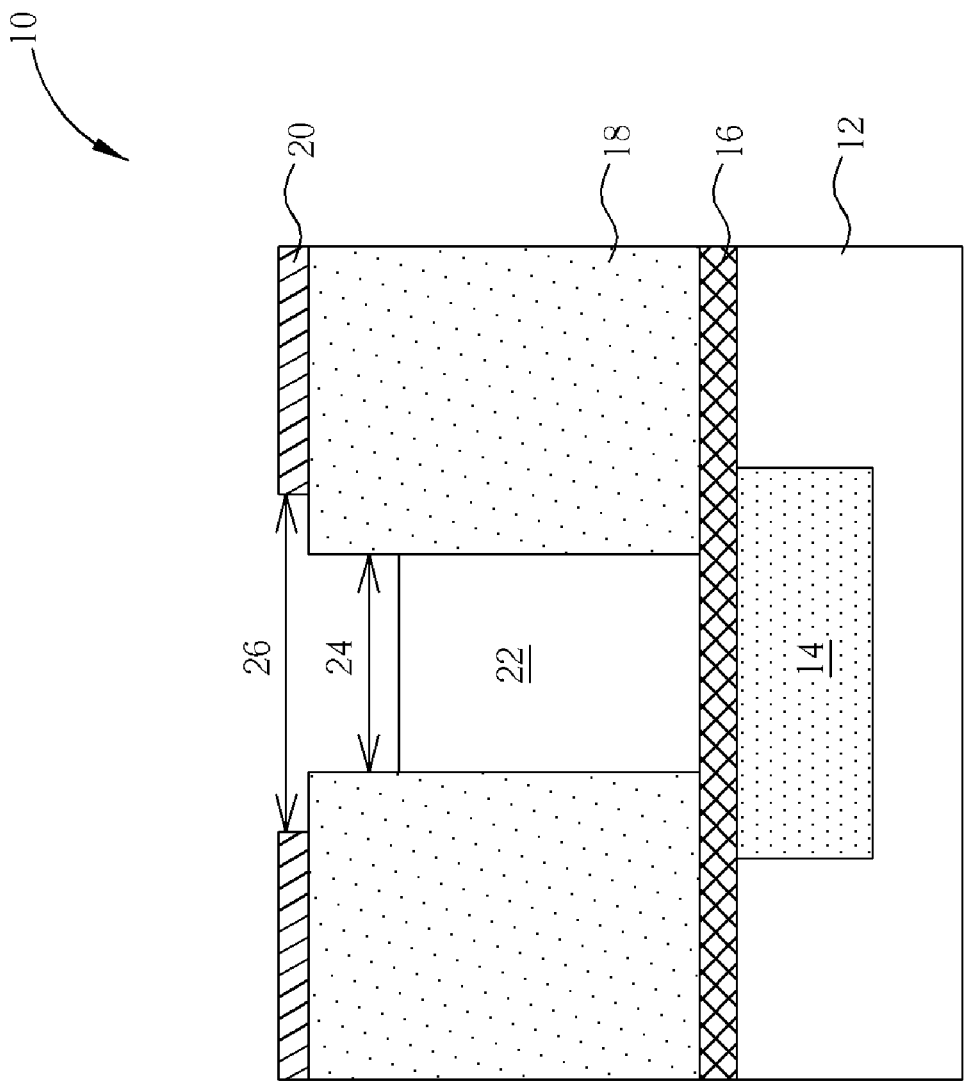

As shown in FIG. 2, the semiconductor wafer 10 is disposed on an electrostatic chunk (not shown) in an etching chamber. The etching chamber has an yttria ($Y_2O_3$) coating on the sidewall. Then, a first etching process is performed. The first etching process comprises step 1.1.

Step 1.1: An oxygen ($O_2$) based plasma gas is used to etch the semiconductor wafer 10 in widespread. The oxygen based plasma gas may comprise 100-500 standard cubic centimeters per minute (sccm) at a chamber pressure between 20-100 millitorrs (mT), and be generated by supplying 300-1500 watts (W) of RF power to an upper electrode and 300-1500 W of RF power to a lower electrode during etching. The oxygen based plasma gas preferably comprises 300 sccm of $O_2$ at a chamber pressure of 30 mT, and is preferably generated by supplying 500 W of RF power to the upper electrodes and 400 W to the lower electrode.

The first etching process may comprise step 1.2 depending on requirements.

Step 1.2: A nitrogen ($N_2$) and oxygen based plasma gas is used to delicately etch the semiconductor wafer 10. The nitrogen and oxygen based plasma gas may comprise 100-300 sccm of $N_2$ and 10-30 sccm of $O_2$ at a chamber pressure between 20-100 mT, and be generated by supplying 100-1000 W of RF power to an upper electrode and 100-1000 W of RF power to a lower electrode during etching. The flow rate of the $N_2$ and $O_2$ is about 10 to 1. The nitrogen and oxygen based plasma gas preferably comprises 200 sccm of $N_2$ and 20 sccm of $O_2$ at a chamber pressure of 20 mT, and is preferably generated by supplying 1000 W of RF power to the upper electrodes and 100 W to the lower electrode.

The first etching process etches the sacrificial layer 22 to a predetermined depth to expose the hard mask 20, the trench pattern 26, and a part of the dielectric layer 18. A part of the sacrificial layer 22 is preserved in the via hole 24 and is removed in the following trench etching process.

Figure 3:
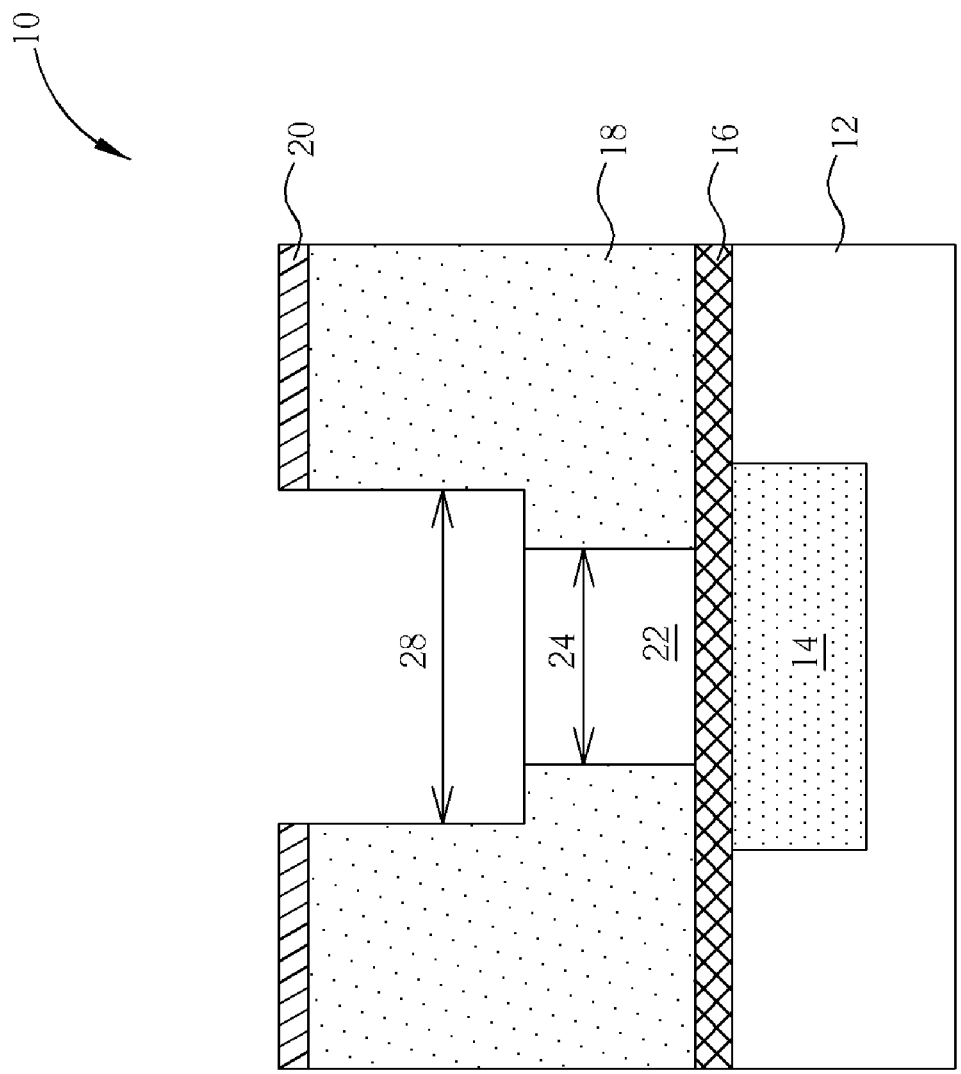

As shown in FIG. 3, a second etching process is performed in the same etching chamber. The second etching process uses a tetrafluoromethane ($CF_4$) based plasma gas as an etch gas. The etch gas may also comprise octafluorcyclobutan ($C_4F_8$), argon (Ar) or oxygen to enhance the ability of removing a polymer generated during the etching process. The selectivity between the hard mask 20, the sacrificial layer 22 and the dielectric layer 18 allows the etch gas to etch the dielectric layer 18 via the trench pattern 26 defined by the hard mask 20 to form a trench 28. A part of the sacrificial layer 22 is etched during the second etching process. Thereafter, only a part of the sacrificial layer 22, which is filled in the via hole 24 is left to protect the cap layer 16 at the bottom of the via hole 24. In the preferred embodiment, the etch gas comprises 5-30 sccm of $C_4F_8$, 100-200 sccm of $CF_4$, 100-200 sccm of Ar, and 5-20 sccm of $O_2$ at a chamber pressure between 30-150 mT, and the etch gas is generated by supplying 150-1500 W of RF power to an upper electrode and 150-1500 W of RF power to a lower electrode during etching. The etch gas preferably comprises 10 sccm of $C_4F_8$, 112 sccm of $CF_4$, 150 sccm of Ar, and 6 sccm of $O_2$ at a chamber pressure of 60 mT, and is preferably generated by supplying 1200 W of RF power to the upper electrodes and 150 W to the lower electrode.

Figure 4:
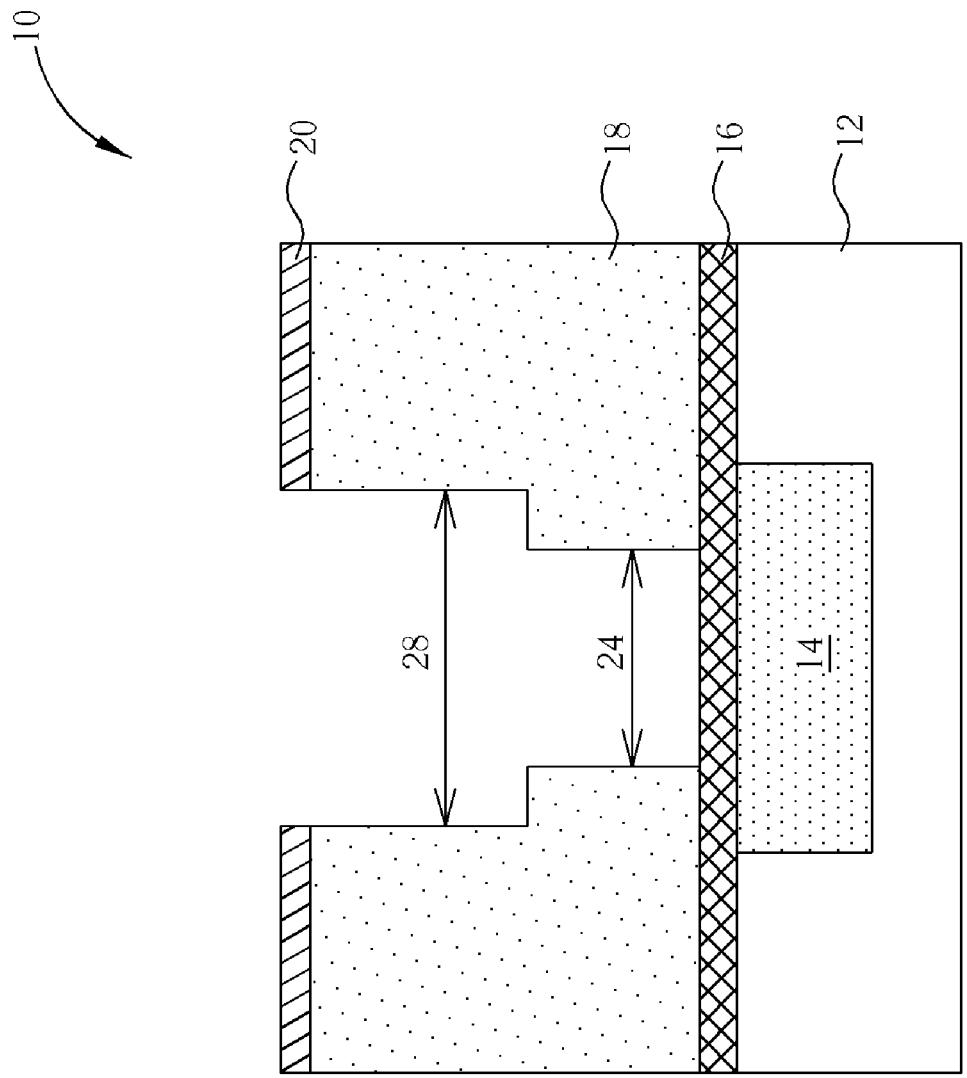

As shown in FIG. 4, a third etching process is performed in the same etching chamber after the trench 28 is formed. The third etching process uses an oxygen based plasma gas to remove the sacrificial layer 22 in the via hole 24. The oxygen based etching gas comprises 500-1000 sccm of $O_2$ at a chamber pressure between 20-50 mT, and the etch gas is generated by supplying 0-1500 W of RF power to an upper electrode and 0-1500 W of RF power to a lower electrode during etching. The third etching process further comprises step 3.1 and step 3.2, in which the operation of step 3.1 depends on time arrangement and the condition of the semiconductor wafer 10. Step 3.1 and step 3.2 are illustrated as follows.

Step 3.1: The oxygen based plasma gas preferably comprises 750 sccm of $O_2$ at a chamber pressure of 20 mT, and is preferably generated by supplying 500 W of RF power to the upper electrodes and 0 W to the lower electrode. In addition, step 3.1 may reduce the memory effect during etching.

Step 3.2: The oxygen based plasma gas preferably comprises 300 sccm of $O_2$ at a chamber pressure of 20 mT, and is preferably generated by supplying 500 W of RF power to the upper electrodes and 200 W to the lower electrode to remove the sacrificial layer 22 in the via hole 24.

In the preferred embodiment, the sacrificial layer 22 is a photoresist, and therefore, the third etching process may be regarded as an ashing process.

Figure 5:
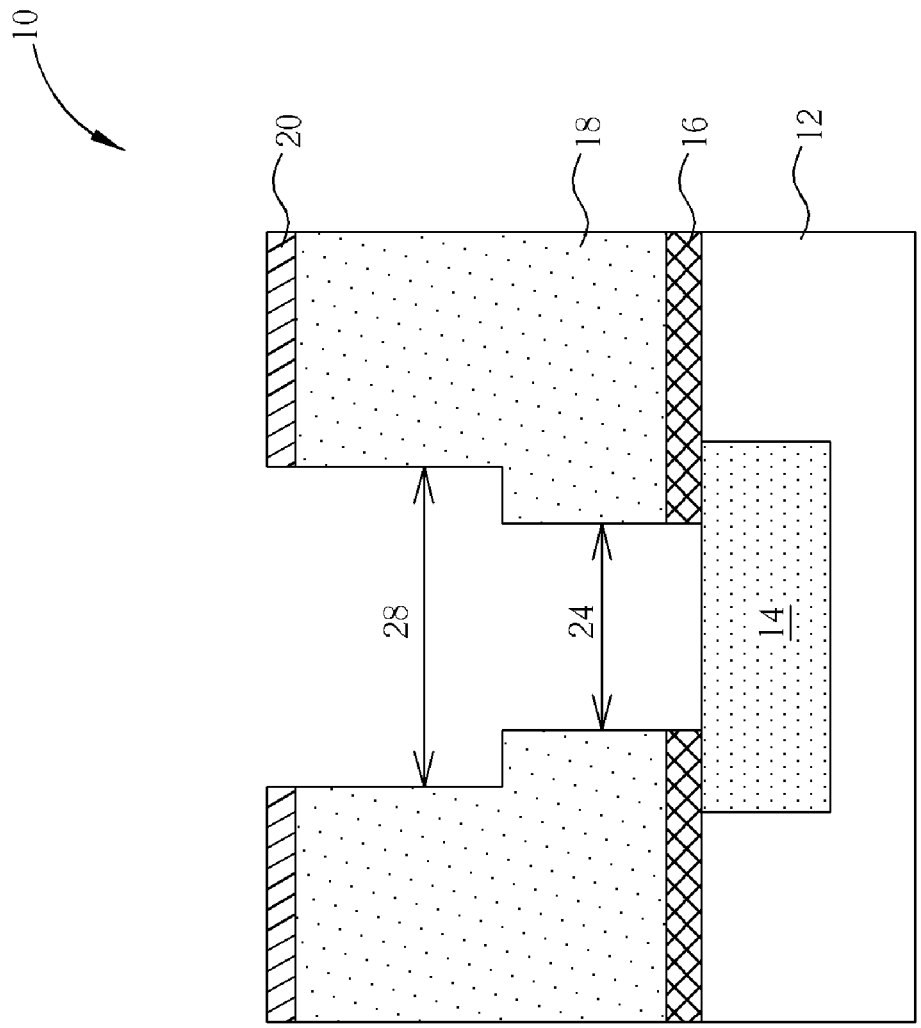

As shown in FIG. 5, a fourth etching process is performed to etch the cap layer 16 in the same etching chamber as the aforementioned etching process. The fourth etching process comprises step 4.1.

Step 4.1: A tetrafluoromethane based plasma gas is used to etch the cap layer 16. The $CF_4$ based plasma gas comprises 100-500 sccm of $CF_4$ at a chamber pressure between 20-100 mT, and the etch gas is generated by supplying 150-1000 W of RF power to an upper electrode and 150-1000 W of RF power to a lower electrode during etching. The $CF_4$ based plasma gas preferably comprises 140 sccm of $CF_4$ at a chamber pressure of 50 mT, and is preferably generated by supplying 600 W of RF power to the upper electrodes and 150 W to the lower electrode.

Several etching steps may also be employed depending on gas residue in the etching chamber and chamber stability. These etching steps include:

Step 4.2: using a nitrogen based plasma gas, which comprises 100-500 sccm of $N_2$ at a chamber pressure between 20-100 mT, and the etch gas is generated by supplying 0-500 W of RF power to an upper electrode and 0-500 W of RF power to a lower electrode during etching. The $N_2$ based plasma gas preferably comprises 260 sccm of $N_2$ at a chamber pressure of 60 mT, and is preferably generated by supplying 400 W of RF power to the upper electrodes and 0 W to the lower electrode.

Step 4.3: using a nitrogen based plasma gas, which comprises 100-500 sccm of $N_2$ at a chamber pressure between 10-100 mT. The $N_2$ based plasma gas preferably comprises 260 sccm of $N_2$ at a chamber pressure of 10 mT. Step 4.3 has a major objective of removing the residual side products in the etching chamber.

Step 4.4: using an argon based plasma gas, which comprises 500-1500 sccm of Ar at a chamber pressure between 20-50 mT. The Ar based plasma gas preferably comprises 1000 sccm of Ar at a chamber pressure of 20 mT. Step 4.4 has a major objective of further removing the residual side products in the etching chamber.

The conductivity layer 14 of the semiconductor wafer 10 is exposed through the via hole 24 during the fourth etching process. Therefore, the etching processes of the dual damascene structure fabrication are finished. The performance of step 4.2, step 4.3, and step 4.4 can remove gas residue and moisture in the etching chamber. In addition, step 4.2, step 4.3, or step 4.4 is performed optionally to obtain the objective of cleaning the etching chamber.

According to the concept of the present invention, performing only two sequential steps of the first etching process, the second etching process, the third etching process, and the fourth etching process is allowable. The present invention discloses another preferred embodiment as follows. At first, a semiconductor wafer comprising a substrate, a conductive layer, a cap layer, a dielectric layer comprising a via hole and a trench, a hard mask comprising a trench pattern, and a photoresist filled in the via hole is provided. The aforementioned first etching process and the second etching process are performed in one etching chamber. Then, the semiconductor wafer is transferred to another etching chamber and is performed with the third etching process to ash the photoresist in situ, the fourth etching process is performed to etch the cap layer to expose the conductivity layer through the via hole. Therefore, the etching processes of the method of fabricating a dual damascene structure are completed. In addition, the first etching process, the second etching process, and the third etching process may be performed in one etching chamber, and the fourth etching process is performed in another etching chamber. According to the above, the method of the present invention has the advantages of flexibility, easy-regulation, and adaptability. The method of the present invention may be adjusted depending on product types and the condition of the machines to improve throughput.

Figure 6:
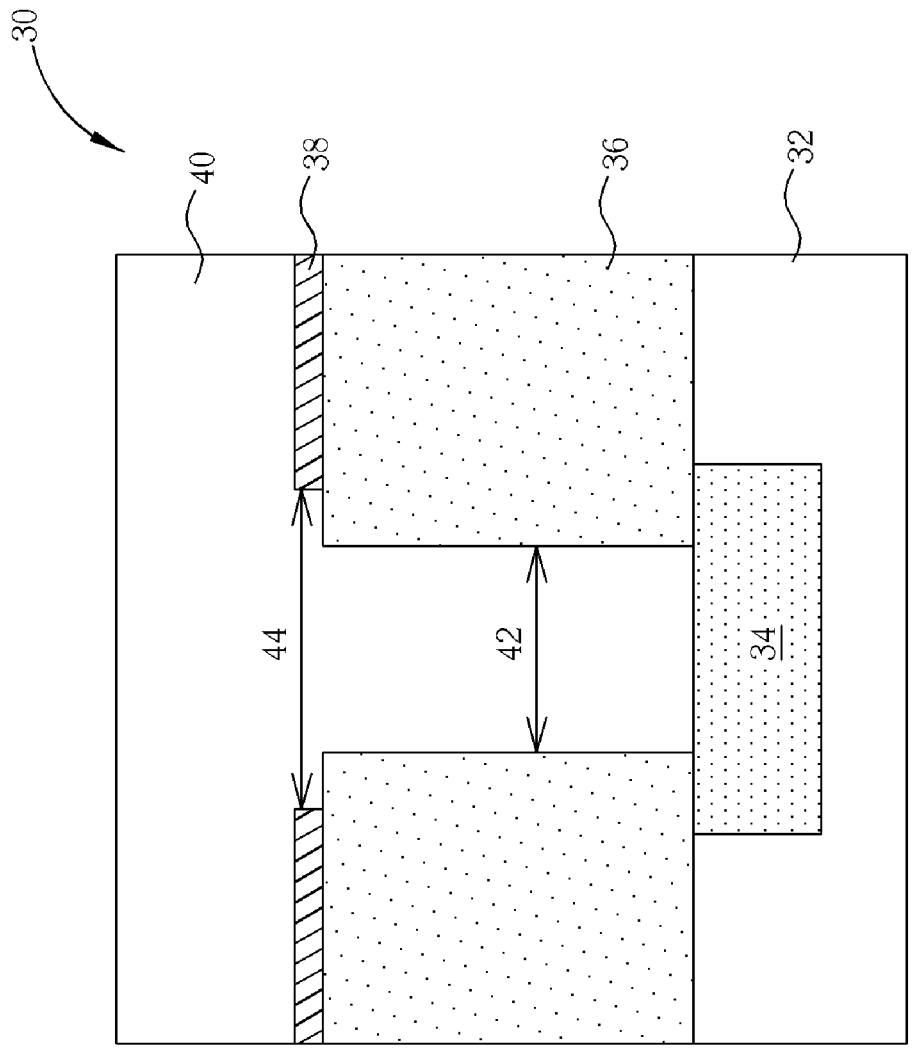
FIG. 6 through FIG. 8 are schematic diagrams illustrating forming a dual damascene structure upon a semiconductor wafer without a cap layer according to another preferred embodiment.
Figure 7:
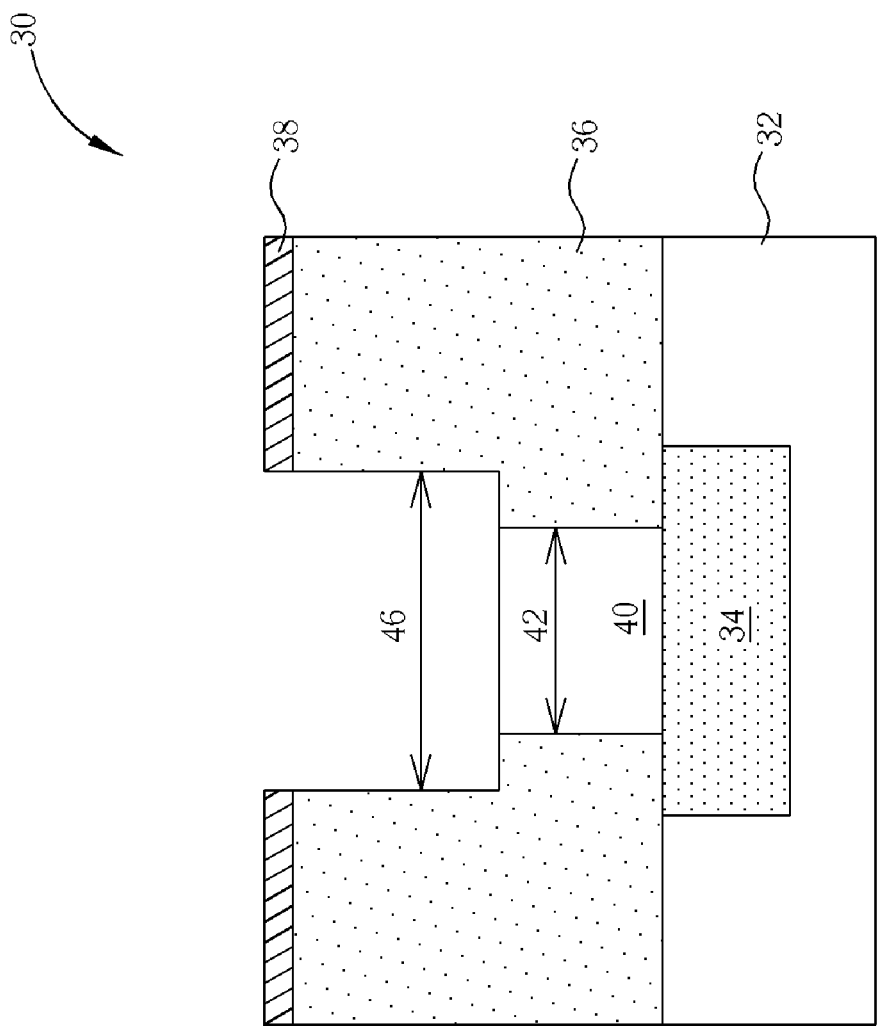
Figure 8:
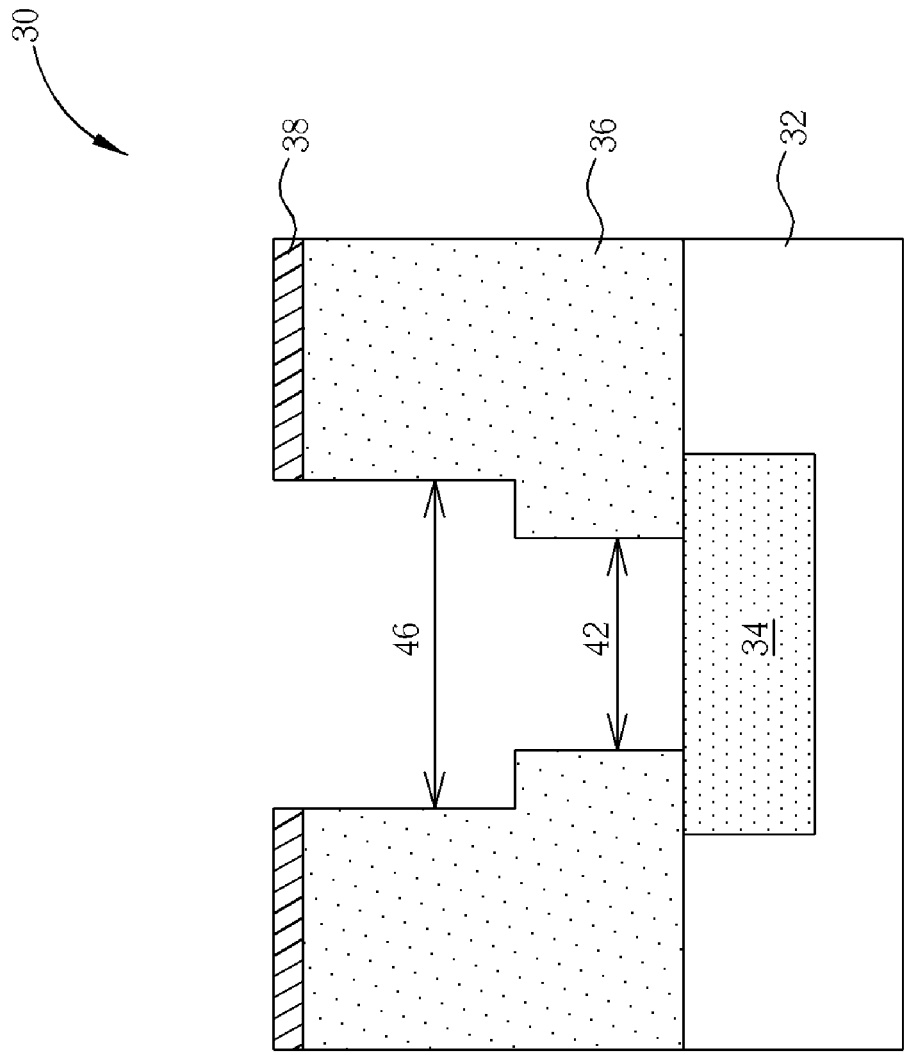

The method of the present invention may also be performed on a semiconductor wafer without the cap layer to form the dual damascene structure. Please refer to FIG. 6 through FIG. 8. FIG. 6 through FIG. 8 are schematic diagrams illustrating forming a dual damascene structure upon a semiconductor wafer without a cap layer according to another preferred embodiment. As shown in FIG. 6, a semiconductor wafer 30 is provided. The semiconductor wafer 30 comprises a substrate 32, a conductive layer 34, a dielectric layer 36 comprising a via hole 42, a hard mask 38 comprising a trench pattern 44, and a photoresist 40 disposed on the hard mask 38, the dielectric layer 36, and the via hole 42. As shown in FIG. 7, a first etching process and a second etching process are performed to form a trench 46. Then, a third etching process is performed to ash the photoresist 40 in order to expose the conductive layer 34 through the via hole 42. In this way, the etching processes of the method of fabricating a dual damascene structure are completed.

According to the above-mentioned embodiment, a barrier layer, a seed layer, and a metal conductive layer are formed on the semiconductor dual damascene by a chemical vapor deposition (CVD) process, a physical vapor deposition process, or an electroplating process. The metal conductive layer comprises copper, aluminum, tungsten, gold, or platinum. A chemical mechanical polishing process is performed to form a metal line and a conductive plug.

The method of the invention employs a "clean mode" recipe, which reduces the memory effect resulting from the conventional deposition mode recipe, and prevents instability. In addition, a cleaning process for the etching chamber may be performed optionally after the semiconductor wafer is removed. The cleaning process removes side products generated during the method of fabricating the dual damascene structure in the etching chamber. Since the etching chamber has the yttria coating on the sidewall, the plasma gas will not damage the etching chamber. In addition, the cleaning process for the etching chamber is performed without a wafer disposed upon the lower electrode of the etching chamber. There is no unused place in the etching chamber and the cleaning process may be performed completely. Therefore, the cleaning process for the etching chamber may be named as a "wafer-less dry clean process". The wafer-less dry clean process comprises the steps of:

First cleaning process: using an oxygen based cleaning plasma gas to clean the etching chamber, and then performing an end point detection to confirm. The oxygen based cleaning plasma gas comprises 500-1000 sccm of $O_2$ at a chamber pressure between 20-30 mT, and the etch gas is generated by supplying 1000-2000 W of RF power to an upper electrode and 1000-2000 W of RF power to a lower electrode during etching. The $O_2$ based cleaning plasma gas preferably comprises 600 sccm of $O_2$ at a chamber pressure of 200 mT, and is preferably generated by supplying 2000 W of RF power to the upper electrodes and 1500 W to the lower electrode.

Second cleaning process: using the oxygen based cleaning plasma gas again in time mode. The second cleaning process is performed during a period to confirm the etching chamber has been cleaned completely. The $O_2$ based cleaning plasma gas preferably comprises 600 sccm of $O_2$ at a chamber pressure of 200 mT, and is preferably generated by supplying 2000 W of RF power to the upper electrodes and 1500 W to the lower electrode.

The following cleaning processes are performed to clean different segments of the etching chamber that may stabilize the condition of the etching chamber. The wafer-less dry clean process further comprises the steps of:

Third cleaning process: using an $O_2$ based cleaning plasma gas that has lower pressure and high flow rate relative to the abovementioned cleaning plasma gases for expelling the residual gases. The $O_2$ based cleaning plasma gas preferably comprises 1200 sccm of $O_2$ at a chamber pressure of 40 mT, and is preferably generated by supplying 2000 W of RF power to the upper electrodes and 1500 W to the lower electrode.

Fourth cleaning process: using a powerless cleaning plasma gas comprising inert gas to expel the residual gases. An argon based cleaning plasma gas is preferred, which comprises 500-1000 sccm of Ar at a chamber pressure between 20-30 mT. The Ar based cleaning plasma gas preferably comprises 800 sccm of Ar at a chamber pressure of 25 mT.

Fifth cleaning process: using a mixed cleaning plasma comprising $CF_4$, $O_2$ and Ar as the cleaning plasma gas at a chamber pressure between 30-100 mT to keep the etching chamber in a stable condition. The flow rate of CF4/O2/Ar is 100-150/0-20/100-200. The mixed cleaning plasma gas preferably comprises 140 sccm of $CF_4$, 10 sccm of $O_2$, and 150 sccm of Ar at a chamber pressure of 60 mT, and is preferably generated by supplying 800 W of RF power to the upper electrodes and 150 W to the lower electrode.

It should be noted that the wafer-less dry clean process may be performed between each etching process of the dual damascene structure fabrication, between each lot of the semiconductor wafer etching process, and even between any etching process being performed.

As described above, the present invention discloses a method of fabricating a dual damascene structure. The etching processes and the ashing process of the method are performed in the same etching chamber. This may greatly reduce the transportation time between machines. The sacrificial layer comprising the photoresist prevents the conductive layer at the bottom of the semiconductor wafer from plasma damage. In addition, the method may be performed utilizing only two sequential etching processes to follow the arrangement of the production lines. With the performance of the wafer-less dry cleaning process, the method may elongate mean time between cleaning, and improve throughput of the semiconductor wafer fabrication.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a dual damascene structure on a semiconductor wafer, the semiconductor wafer sequentially comprising a substrate, a conductive layer, a dielectric layer comprising a via hole, a hard mask comprising a trench pattern larger than the via hole in bird's eye view, and a sacrificial layer disposed on the hard mask, the dielectric layer, and the via hole so as to completely cover the hard mask comprising the trench pattern, the dielectric layer and the via hole, the method being performed in an etching chamber and comprising at least two sequential steps of:

performing a first etching process, the first etching process using an oxygen based plasma gas to etch a part of the sacrificial layer and expose the hard mask, the dielectric layer, and a part of the via hole;

performing a second etching process, the second etching process using a tetrafluoromethane ($CF_4$) based plasma gas to widen the via hole to form a trench; and performing a third etching process, the third etching process using an oxygen based plasma gas to remove the sacrificial layer to expose the conductive layer through the via hole.

2. The method of claim 1, wherein the semiconductor wafer further comprises a cap layer disposed between the dielectric layer, the via hole and the conductive layer.

3. The method of claim 2, further comprises a step of performing a fourth etching process, the fourth etching process using a tetrafluoromethane based plasma gas to etch the cap layer to expose the conductive layer through the via hole.

4. The method of claim 1, further comprising a wafer-less dry clean process for cleaning the etching chamber after the semiconductor wafer is removed.

5. The method of claim 4, wherein the wafer-less dry clean process uses a cleaning plasma gas comprising oxygen, argon, tetrafluoromethane, or a mixture of the above.

6. The method of claim 4, wherein the wafer-less dry clean process comprises steps of:

using an oxygen based cleaning plasma gas and utilizing an end point detection for confirmation; and using an oxygen based cleaning plasma gas in time mode for further cleaning.

7. The method of claim 6, wherein the wafer-less dry clean process further comprises steps of:

using an oxygen based cleaning plasma gas with high flow rate and low pressure relative to the gases in claim 6;

using an argon based cleaning plasma gas; and using a mixed cleaning plasma comprising tetrafluoromethane, oxygen, and argon.

8. The method of claim 4, wherein the etching chamber comprises an yttria ($Y_2O_3$) coating on the sidewall.

9. The method of claim 1, wherein the first etching process further comprises a step of using a nitrogen and oxygen based plasma gas.

10. The method of claim 1, wherein the third etching process further comprises a step of using an oxygen based plasma gas.

11. The method of claim 1, wherein the fourth etching process further comprises a step of using a nitrogen based plasma gas.

12. The method of claim 11, wherein the fourth etching process further comprises a sub-step of using a nitrogen based plasma gas for cleaning the etching chamber.

13. The method of claim 12, wherein the fourth etching process further comprises a step of using an argon based plasma gas for cleaning the etching chamber.

* * * * *